United States Patent [19]
Dai et al.

[11] Patent Number: 5,877,075
[45] Date of Patent: Mar. 2, 1999

[54] DUAL DAMASCENE PROCESS USING SINGLE PHOTORESIST PROCESS

[75] Inventors: Chang-Ming Dai, Hsinchu; Jammy Chin-Ming Huang, Taipei, both of Taiwan

[73] Assignee: Industrial Technology Research Institute, Hsin-Chu, Taiwan

[21] Appl. No.: 949,350

[22] Filed: Oct. 14, 1997

[51] Int. Cl.$^6$ .................................................. H01L 21/44
[52] U.S. Cl. ...................... 438/597; 438/624; 438/638; 438/700
[58] Field of Search ................................... 438/597, 622, 438/624, 636, 637, 638, 675, 700, 738, 740

[56] References Cited

U.S. PATENT DOCUMENTS

| | | | |
|---|---|---|---|
| 5,427,649 | 6/1995 | Kim et al. | 156/661.11 |
| 5,529,953 | 6/1996 | Shoda | 438/644 |
| 5,602,053 | 2/1997 | Zheng et al. | 437/60 |
| 5,614,765 | 3/1997 | Avanzino et al. | 257/774 |
| 5,705,430 | 1/1998 | Avanzino et al. | 438/618 |
| 5,726,100 | 3/1998 | Givens | 438/637 |
| 5,783,485 | 7/1998 | Ong et al. | 438/637 |
| 5,795,823 | 8/1998 | Avanzino et al. | 438/639 |
| 5,814,557 | 9/1998 | Venkatramam et al. | 438/660 |

OTHER PUBLICATIONS

S. Wolf et al, "Silicon Processing For The VLSI Era", vol. 1, Lattice Press, Sunset Beach, CA, 1986, p. 443 (no month).

*Primary Examiner*—Tuan H. Nguyen
*Attorney, Agent, or Firm*—George O. Saile; Stephen B. Ackerman

[57] ABSTRACT

A simplified method is disclosed for forming dual damascene patterns using a single photoresist process. A substrate is provided with a tri-layer of insulation formed thereon. A layer of photoresist is formed on the substrate and is imaged with a hole pattern by exposure through a dark field mask. Hole is formed in the photoresist by a wet etch. As a key step, the photoresist is next subjected to post-exposure bake such that the sensitivity of the photoresist is still retained. The same photoresist layer is then exposed for the second time for aligned line patterning using a "clear-field" mask. The line patterned region is cross-linked by performing pre-silylation bake, which region in turn is not affected by the subsequent silylation process that forms a silicon rich mask in the field surrounding the hole and line patterns. The vertical hole is transferred into the middle layer of the underlying composite layer by dry etching. Twine pattern which is next formed in the same photoresist layer is transferred into the top layer of the composite layer while at the same time the hole pattern is transferred to the bottom layer. Having thus formed the vertical hole interconnect and line trench into the insulation layer, metal is deposited into the dual damascene pattern. Any excess metal on the surface of the insulating layer is then removed by any number of ways including chemical-mechanical polishing, thereby planarizing the surface and readying it for the next semiconductor process.

29 Claims, 5 Drawing Sheets

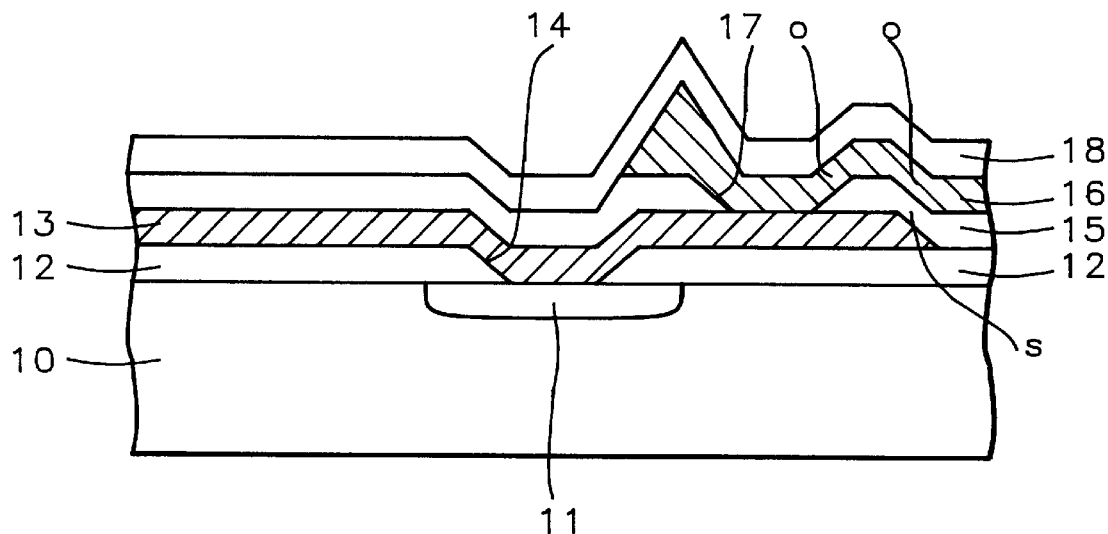
FIG. 1 - Prior Art
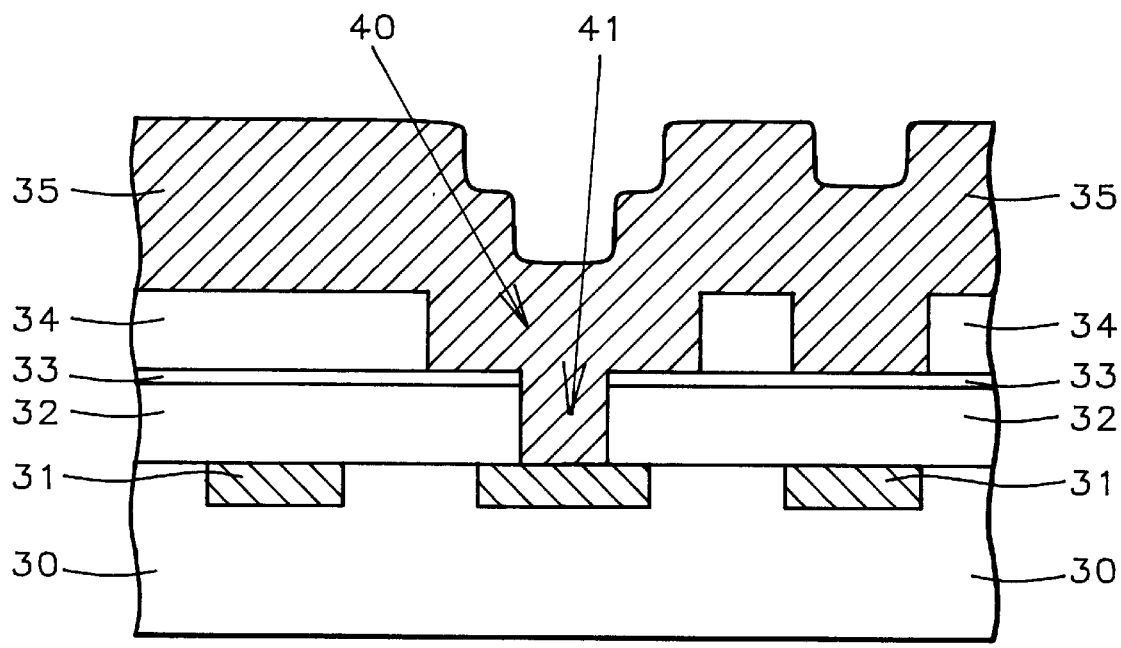
FIG. 2a - Prior Art

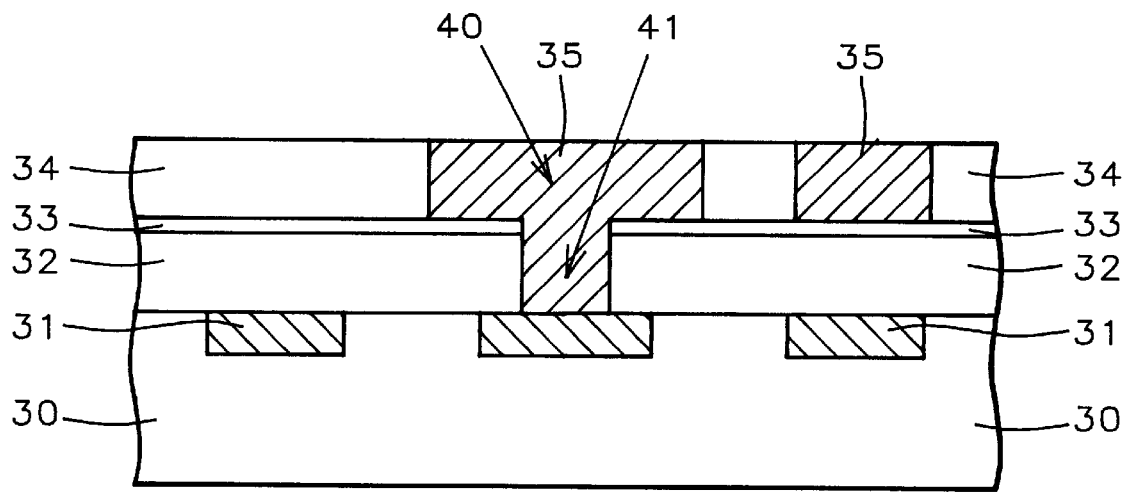
FIG. 2b – Prior Art
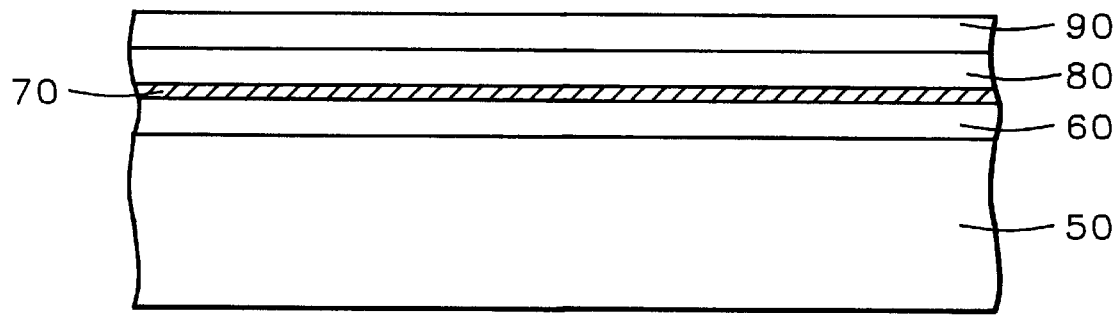
FIG. 3a
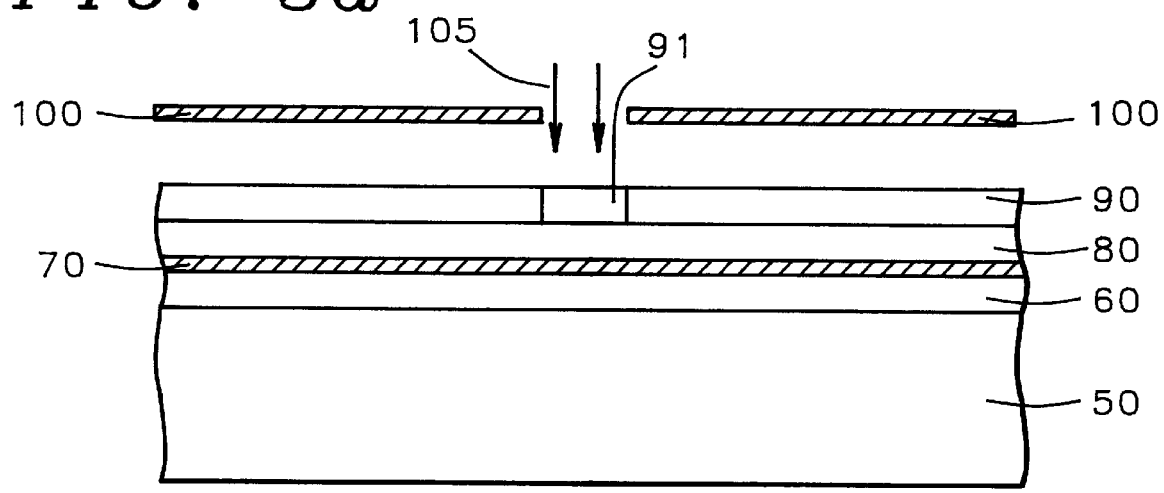
FIG. 3b

DUAL DAMASCENE PROCESS USING SINGLE PHOTORESIST PROCESS

RELATED PATENT

U.S. patent application by the same inventor C. M. Dai filed Oct. 14, 1997, Ser. No. 08/949,358 entitled "Two-layered TSI Processes for Dual Damascene Patterning"; filed Oct. 14, 1997, Ser. No. 08/949,353 entitled "Single-mask Dual Damascene Processes by Using Phase-shifting Mask"; filed Oct. 14, 1997, Ser. No. 08/949,354 entitled "Self-Aligned Dual Damascene Patterning Using Developer Soluble ARC Interstitial Layer"; and filed Oct. 14, 1997, Ser. No. 08/949,352 entitled "Opposed Two-Layered Photoresist Process for Dual Damascene Patterning", assigned to common assignee.

BACKGROUND OF THE INVENTION

(1) Field of the Invention

The present invention relates to the manufacture of ultra large scale (ULSI) integrated chips in general, and in particular, to an integrated method of forming interconnect layers using a single photoresist process as an improvement for dual damascene metal wiring technology.

(2) Description of the Related Art

Wiring technology for semiconductor chips has been demanding more and more innovative approaches to metallization processes as the circuit integration levels have been increasing dramatically. Conventionally, the metallization process requires a patterned photoresist layer on each metal layer to form the metal lines thereon. The metal layers must also be interconnected to devices in the semiconductor substrate on which the chips are fabricated, as well as to other metal layers that form the circuits in the substrate. The vertical connections are made through holes formed in insulation layers separating the metallized layers. They also need their own photoresist processes. As the number of metallized layers have been increasing, so have the photoresist processes which complicate the manufacture of semiconductor chips. The significance of the use of the presently disclosed single photoresist process in the combined metallization of horizontal trenches and vertical holes in the ULSI technology becomes more apparent when one considers the challenges associated with the forming of interconnections in the high performance chips of related art.

In order to affect more readily the migration of the very large scale integrated (VLSI) technology towards the ULSI technology for higher speed and performance of computers, the semiconductor industry has been providing in rapid succession new techniques and technologies for manufacturing very tightly packed semiconductor chips. As is well known by those versed in the art, closer proximity of devices in a tightly packed chip not only provides higher propagation speed of electrical signals by the sheer reduction in the traveled distance between the devices, but also by the reduced impedance encountered in the shortened medium through which the signals travel. On the other hand, tightly packed, ultra large scale integration can be achieved with only ultra small devices and interconnections. The interconnections in turn must be formed in a such a manner so as to minimize the increased resistance to signal propagation through the reduced cross-section of the wiring metal stripes. It is especially important to avoid mating contacts and favor solid connections where possible.

A semiconductor chip normally contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. In prior art, there are many different methods of forming metal lines and interconnections between them. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

To provide robust contact area at the junction where the metal lines contact the devices or the via plugs in the case of multilayer wiring, it is usually necessary to increase the dimensions of the various features in the metal line and the holes to compensate for overlay errors and process bias inherent in lithographic process. This increase in the size of the design ground rules results in a significant loss in circuit layout density. Furthermore, there is considerable development effort expended on photolithographic equipment and processes to make improvement in overlay error and process tolerances. To minimize the chip area devoted to overlay tolerance and lithography costs, several "self-aligned" processes have been developed by workers in the field.

There are also other problems associated with forming contacts between metal layers in a substrate. Where contact windows are etched into a dielectric layer, the sides of the contact windows must be sloped to guarantee good continuity of the metal layer as it descends into the contact window. The steeper the slope, the more likely it is the metallurgy will have breaks at the edges of the contact windows. However, the use of a gradually sloped sidewall to guarantee metal line continuity takes up valuable chip area and prevents contact windows from being packed as closely as desired. In addition, the use of contact windows creates an irregular and nonplanar surface which makes it difficult to fabricate the subsequent interconnecting layers as shown in FIG. 1.

The structure shown in FIG. 1 is a typical example of a semiconductor substrate fabricated using prior art techniques. After having defined device regions represented by reference (11) on substrate (10), a first insulating layer (12) is formed and patterned thereon. First level metal layer (13) is next deposited to make contact with region (11) through contact window (14). Similarly, the second level metal layer (16) makes contact with metal layer (13) through via hole (17) patterned in second insulating layer (15). The structure is passivated with a third insulating layer (18). Although the structure depicted in FIG. 1 is not to scale, it exemplifies a very irregular surface which creates reliability problems. One such problem is the potential short at location (S) between the first and second levels of metal layers, due to the thinning of the insulating layer therebetween, and still another one is the risk of a potential open circuit at locations (O), due to the thinning of the metal layer at that location.

One solution that is found in prior art in addressing the problems cited above is the so called Dual Damascene process. In its simplest form, this process starts with an insulating layer which is first formed on a substrate and then planarized. Then horizontal trenches and vertical holes are etched into the insulating layer corresponding, respectively, to the required metal line pattern and hole locations that will descend down through the insulating layer to the underlying features, that is, to device regions if through the first insulating layer, or to the next metal layer down if through an upper insulating layer in the substrate structure. Metal is next deposited over the substrate thereby filling the trenches and the holes, and hence forming metal lines and the interconnect holes simultaneously. As a final step, the resulting surface is planarized using the well-known chemical-mechanical polish (CMP), and readied to accept another dual damascene structure, that is, integrally inlaid wiring both in the horizontal trenches and vertical holes, hence the duality of the process.

A dual damascene structure before and after CMP is shown in FIGS. 2a and FIG. 2b. Two photolithographic processes and two insulator layers separated by an etch stop layer are employed to achieve the shown structure as follows: a starting planarized surface (30) is provided with patterned first level metal (31). A first layer of insulator (32) is deposited over a fist level of patterned metal to which contacts are to be selectively established. The first layer is planarized and then covered by an etch stop material (33). Contact holes are defined in the etch stop material by a first photolithography at locations where vertical plug interconnects are required. The thickness of the first insulator layer (32) is made equal to the desired plug height. The first insulator layer is not etched at this time. Next, a second insulator layer (34), having a thickness equal to the thickness of the second level of patterned metal of the multi-level structure, is deposited over the etch stop material (33). The second insulator layer (34), in turn, is etched by second photolithography down to the etch stop material (33) to define desired wiring channels (40), some of which will be in alignment with the previously formed contact hole (41) in the etch stop material. In those locations where the contact holes are exposed, the etching is continued into the first insulator layer to uncover the underlying first level of patterned metal. The horizontal channels and vertical holes etched into the second and first insulator layers are next overfilled with metal (35). As a final step, excess metal (35) on top of the second insulator layer (34) but not in the channels (40) or holes (41) is removed by etching or chemical-mechanical polishing, as shown in FIG. 2b.

It will be appreciated by those skilled in the art that the dual damascene process alleviates the problem of registration of holes with metal lines, and the concomitant contact problems along with the issue of excessive overlay tolerances. At the same time, wiring can be kept to the minimum ground rules tolerances and also problems associated with the thinning of insulator and/or metal around sloped holes can be circumvented. However, it is also evident that the process is complicated, especially in the area where two photolithographic steps must be performed to form the vertical holes. Here, the hole pattern must first be defined lithographically after the etch stop has been formed, and also later when the hole is etched lithographically. Furthermore, two photoresist processes must be used to form the hole and line patterns. The multiplicity of the processes results in lower productivity, and increased cost.

Nevertheless, in prior art, dual damascene process has been used to advantage. For example, Shoda discloses in U.S. Pat. No. 5,529,953 a method of manufacturing a stud (vertical metal plug) and (horizontal) interconnect in a dual damascene structure using selective deposition where the selective deposition is accomplished through repeated application of masks and photolithographic processes. Similarly, Zheng in U.S. Pat. No. 5,602,053 discloses a dual damascene antifuse structure where sandwiched layers are formed. In another approach, recognizing the multiplicity of mask patterning steps in dual damascene process, Avanzino in U.S. Pat. No. 5,614,765 teaches the use of one mask pattern for the formation of both the conductive lines and the vias simultaneously.

It is advantageous, therefore, to be able to replace the complicated portions of dual damascene process with simpler methods, and apply the process more effectively to the manufacture of semiconductor substrates and chips. It is disclosed in this present invention that by removing the necessity of having two photoresist processes the present state of the art of dual damascene process can be improved substantially. This is accomplished by incorporating a modified silylation process into dual damascene process. In other words, only one silylated photoresist layer is used as disclosed in the embodiments below. Although in a related art, Kim of U.S. Pat. No. 5,427,649 discloses a method for forming a pattern by silylation, his method is still complicated in view of the multiple layers of photoresist he uses.

SUMMARY OF THE INVENTION

It is therefore an object of this invention to provide a simplified method of forming dual damascene patterns using single photoresist process in the manufacture of semiconductor substrates and chips.

It is another object of this invention to integrate silylation process into dual damascene patterning process.

It is still another object of this invention to provide a method for improving the alignment of a wiring layer to underlying interconnect hole pattern.

It is yet another object of this invention to provide a method for reducing overlay tolerances and process bias in order to increase the packing density of ultra large scaled integrated chips.

These objects are accomplished by providing a substrate having a composite layer of insulation deposited thereon whereby said composite layer comprises a top layer of dielectric separated from a bottom layer of dielectric by an intervening middle layer of dielectric; forming a layer of photoresist on said composite layer; hole patterning said first layer of photoresist; post-exposure baking of said layer of photoresist; superimposing a line patterning on said hole patterning in said layer of photoresist; performing a pre-silylation bake of said layer of photoresist; silylating said layer of photoresist to form a silylated mask comprising said hole pattern; transferring said hole pattern in said silylated layer into said top and middle layer of said composite layer of insulation by etching; forming line pattern in said layer of photoresist by etching; transferring said line pattern in said layer of photoresist into said second layer of dielectric to form a line trench, and simultaneously transferring said hole pattern in said first layer of dielectric to form a interconnect hole; removing said layer of photoresist; and depositing metal into said trench and said hole to form a dual damascene structure and planarizing said composite layer.

BRIEF DESCRIPTION OF THE DRAWINGS

In the accompanying drawings, similar numerals refer to similar parts throughout the several views.

FIG. 1 is a partial cross-sectional view of a semiconductor substrate showing a non-planar multilayered metal structure resulting from prior art methods.

FIGS. 2a–2b are partial cross-sectional views of a semiconductor substrate showing the conventional forming of a dual damascene structure before and after planarization.

FIG. 3a is a partial cross-sectional view of a semiconductor substrate having a photoresist layer formed on a composite layer of insulation according to this invention.

FIG. 3b is a partial cross-sectional view of a semiconductor substrate showing the hole patterning of the layer of photoresist of FIG. 3a, according to this invention.

DESCRIPTION OF THE PREFERRED EMBODIMENTS

Figure 3C:
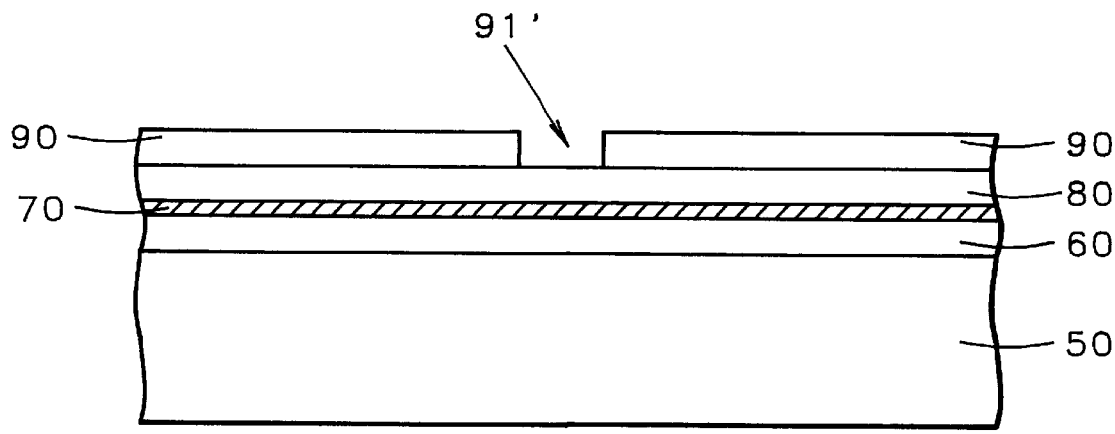
FIG. 3c is a partial cross-sectional view of a semiconductor substrate showing the forming of the hole pattern in the layer of photoresist of FIG. 3b, according to this invention.

Referring now to the drawings, in particular to FIGS. 3a–3k, there are shown schematically steps in forming dual damascene pattern employing a single layer photoresist process in conjunction with silylation process.

In FIG. 3a, substrate (50) is provided with a composite tri-layer dielectric insulation comprising bottom and top layers (60) and (80), respectively, and a middle layer (70). A first layer of photoresist (90) is next formed on the composite layer.

It is preferred that top and bottom layers of insulation, that is, layers (60) and (80), are plasma enhanced chemical vapor deposited (PECVD) phosphosilicate glass (PSG) in a low pressure environment at a chamber pressure between about 0.5 to 10 torr, temperature between about 300° C. to 600° C. with reactant gas $SiH_4$ at a flow rate between about 100 to 500 standard cubic centimeters per minute (sccm) in a diluent carrier gas $PH_3$ at a flow rate between about 20 to 200 sccm. The thickness of bottom (60) and top (80) layers of dielectric are between about 0.3 to 0.7 micrometers ($\mu$m).

The middle layer (70) is an etch barrier film such as silicon nitride (SiN) to prevent the upper trench line patterns of dual damascene from being etched through if the layer underlying the composite insulation layer is for via hole or contact hole. (It will briefly be noted here that substrate (50) in FIG. 3a is provided with a substructure of devices formed in the substrate and/or metal layers thereof, and as they are not significant to the invention, they are not described in detail in order not to unnecessarily obscure the present invention.) Other barrier films may be used, however silicon nitride is preferred because it becomes part of the composite insulation layer and has different etch characteristics than silicide regions and can be used as ARC layer. That is, silicon nitride allows a selective etch process with respect to different underlying materials and also eliminates reflection of incident light. Spin-on-glass and CVD nitride are also suitable as etch stop materials when polyimide layers are used. It is preferred that silicon nitride is deposited using plasma enhanced PEVCD and that it has a thickness between about 500 to 2000 angstroms (Å).

The surface of layer (80) in FIG. 3a is planarized, preferably using chemical-mechanical polishing process. Etching back or using capping method are also suitable for planarizing the surface of layer (80). Then, a layer of photoresist (90) is formed on PSG layer (80). It is preferred that photoresist (90) is a chemical amplification resist (CAR) and it is of positive (p)-type. The CAR is made using a photo acid generator (PAG) instead of the conventional photosensitive agent, and an example of (p)-type resist is K2G made by JSR in Japan.

The preferred thickness of layer of photoresist (90) shown in FIG. 3a is between about 0.5 to 0.9 $\mu$m. A dark field mask (100) is used to expose (105) photoresist layer (90) to form vertical hole pattern (91). It will be noted in passing that a mask that is opaque in the regions, or field areas (90), surrounding the patterned area (91) shown in FIG. 3b is referred to as a "dark field" mask. A "clear field" mask, which is used at a later step on the other hand, is the inverse where light is allowed over the field areas and not over the patterned areas. Thus, light (105) in FIG. 3b exposes hole pattern (91), causing the PAG to generate acid which in turn alters (decomposes) the resin in the exposed region. The exposure strength is between about 10 to 80 milijoules (mj)/cm$^2$.

Next, a post-exposure bake is performed where it is critical that the temperature be between about 80° to 100° C. This is because, the chemical amplification resist (90) must still retain sufficient sensitivity for a subsequent second exposure to form the line pattern superimposed on the hole pattern. Prior to the line patterning exposure, however, hole (91') is first formed as shown in FIG. 3c by using a conventional wet development process, such as stream puddle with developer TMAH at 2.38% for about 45 to 70 seconds, (See S. Wolf and R. N. Tauber, "Silicon Processing for the VLSI Era," vol. 1, Lattice Press, Sunset Beach, Calif., 1986, p.443.

Figure 3D:
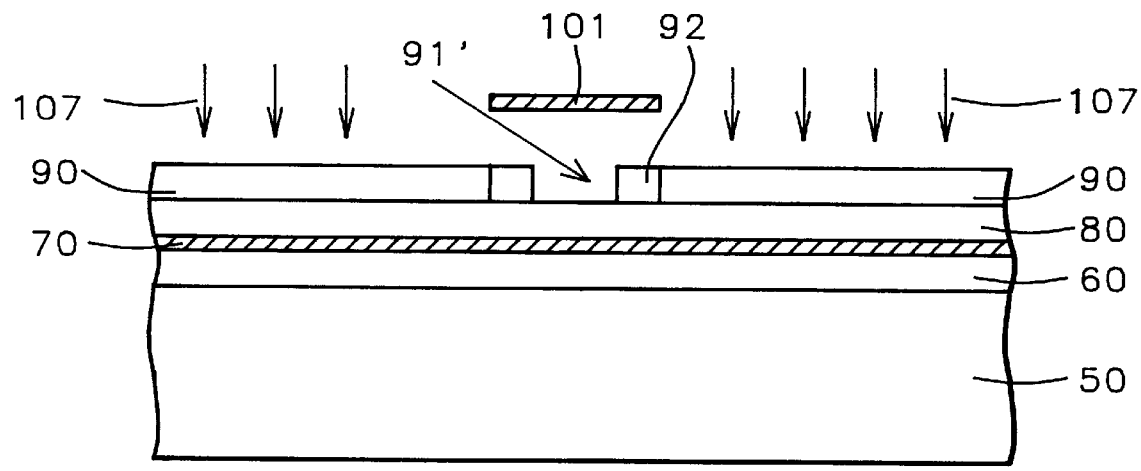
FIG. 3d is a partial cross-sectional view of a semiconductor substrate showing the forming of the line pattern in the layer of photoresist of FIG. 3c, according to this invention.
Figure 3E:
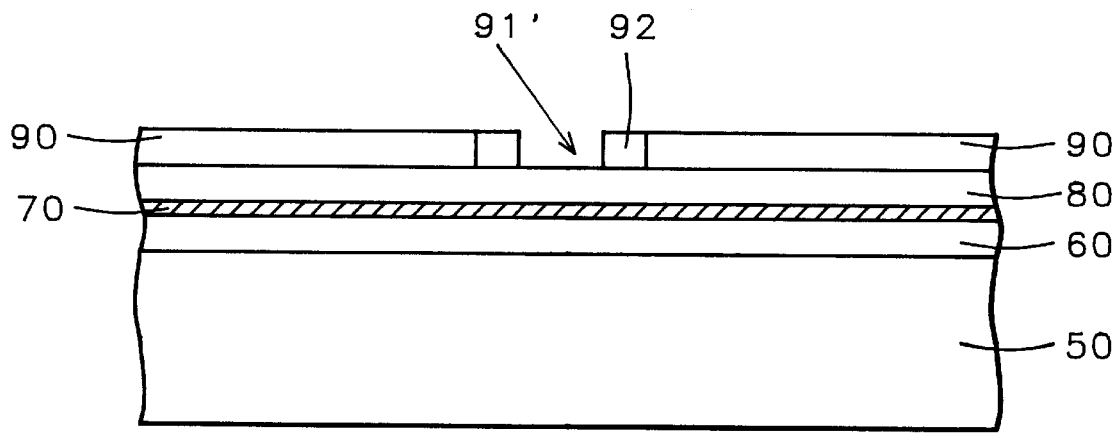
FIG. 3e is a partial cross-sectional view of a semiconductor substrate showing the cross-linking of the line pattern of FIG. 3d by subjecting it to pre-silylation bake, according to this invention.
Figure 3F:
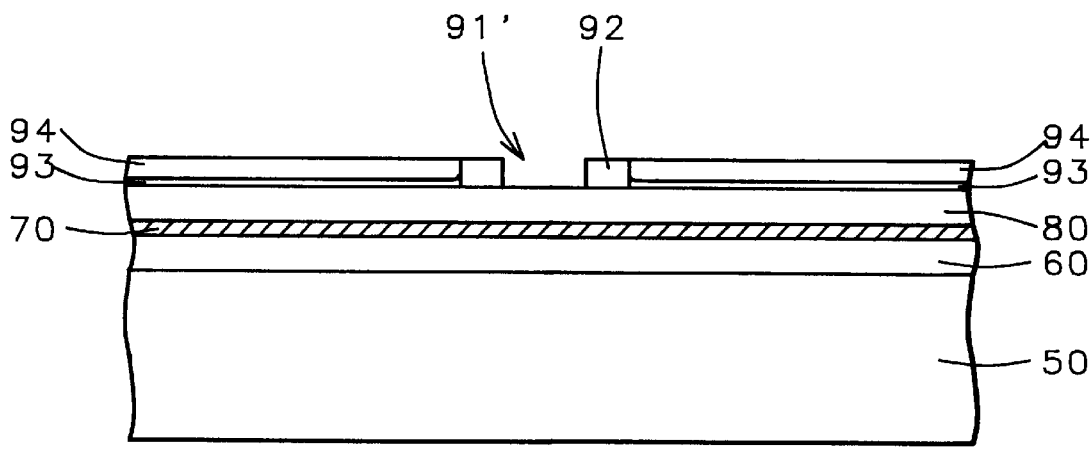
FIG. 3f is a partial cross-sectional view of a semiconductor substrate showing the silylation of the layer of photoresist of FIG. 3e, according to this invention.

In accordance with the main feature of this invention, the same single layer of photoresist (90) of FIG. 3c is exposed for the second time through a "clear field" mask shown in FIG. 3d, thereby being imaged with a line pattern (92) adjacent to and surrounding hole (91'). It will be understood that since light (107) exposes field regions (90) through "clear-field" mask (101), PAG in the photoresist generates acid which in turn alters the resin in the exposed region (92). It is preferred that the exposure is between about 20 to 100 mj/cm$^2$. This unexposed line pattern region (92) is cross-linked as the next step in FIG. 3e where a pre-silylation bake (PSB) is performed at a temperature between about 130° to 180° C.

The follow-on silylation process is accomplished by diffusing a silylating agent at a temperature between about 140° to 210° C., which affects the exposed areas (90) and not the cross-linked areas (92) by introducing silicon to the organic compounds in the resist layer (90). Deeper layer (93) shown in FIG. 3f also remains unaffected. The net result is the formation of silicon rich, silylated layer (94) with a thickness between about 1000 to 4000 angstroms (Å). The preferred silylating agent in this invention is tetra-methyl di-silazane (TMDS) which includes silicon though hexamethyl disilazane (HMDS), Silane, etc., can also be used.

Figure 3G:
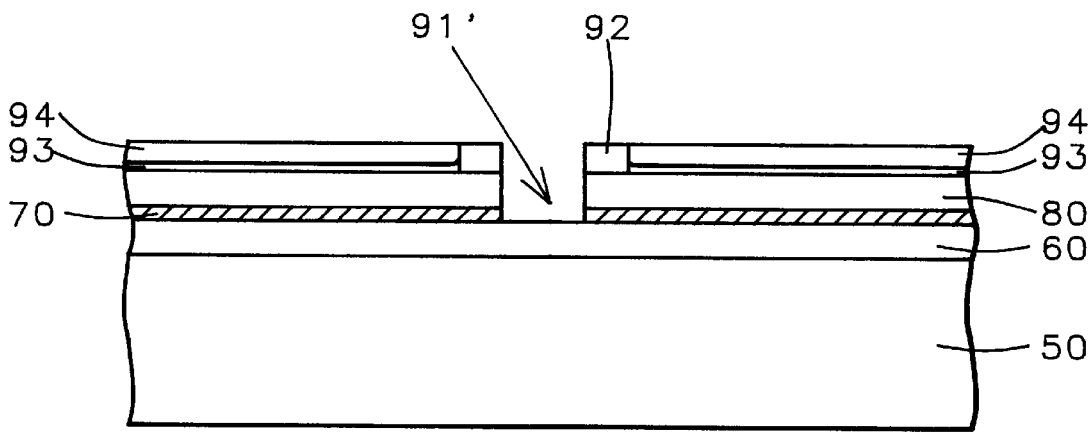
FIG. 3g is a partial cross-sectional view of a semiconductor substrate showing the transferring of the hole pattern in the layer of photoresist of FIG. 3f into the top and middle layer of the composite layer, according to this invention.
Figure 3H:
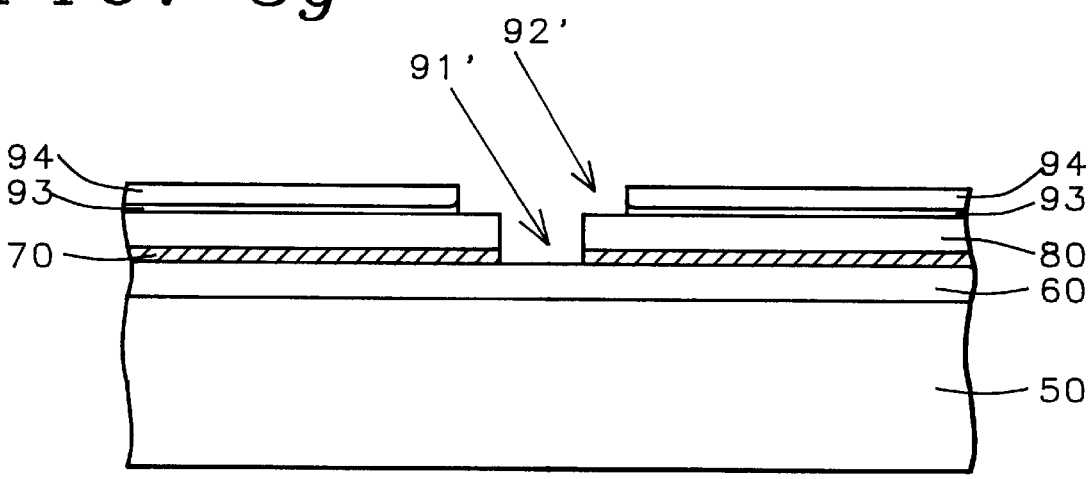
FIG. 3h is a partial cross-sectional view of a semiconductor substrate showing the forming of the line pattern in the layer of photoresist of FIG. 3g, according to this invention.

Next, hole pattern (91') in the photoresist layer is transferred into the top layer (80) of the underlying composite layer as shown in FIG. 3g by using a dry oxide etch recipe comprising Ar at a flow rate between about 50 to 150 sccm, CHF$_3$ at between about 10–50 sccm, C$_4$F$_8$ at between about 0–22 sccm in a high density plasma (HDP) etcher. This is followed by a further etch through the middle layer (70) with a SiN etching recipe comprising CHF$_3$ at a flow rate between about 0 to 100 sccm, CF$_4$ at between about 0 to 50 sccm, and Ar at between about 50 to 150 sccm. Then, line pattern (92') is formed into the photoresist layer as shown in FIG. 3h by anisotropically etching the cross-linked region (92) thereby also removing any photoresist residues left behind in the hole in the previous etching process by using resist etching recipe comprising O$_2$ at a rate between about 10 to 250 sccm, He at between about 40 to 80 sccm, SO$_2$ between about 10 to 80 sccm, and CF$_4$ at a flow rate between about 0 to 50 sccm.

Figure 3I:
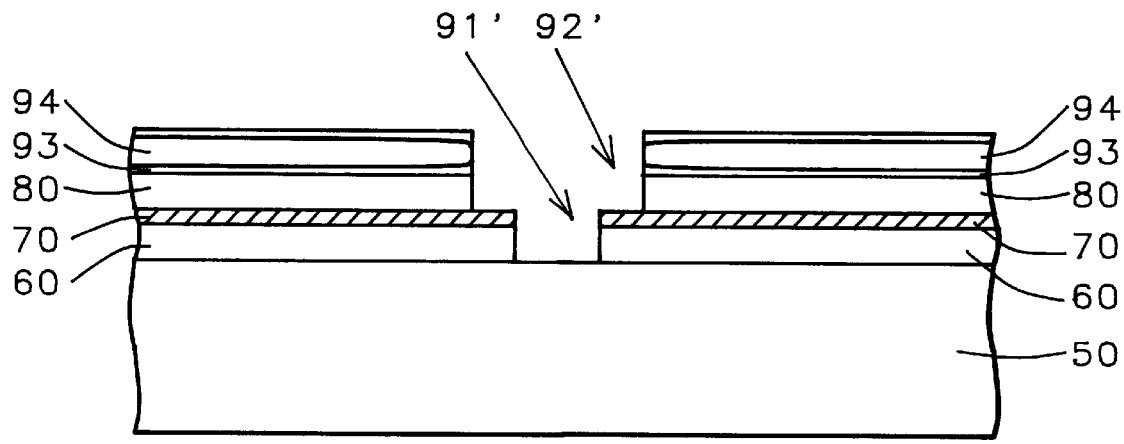
FIG. 3i is a partial cross-sectional view of a semiconductor substrate showing the transfer of line pattern in the layer of photoresist into the top layer of the composite layer to form a line trench, and the simultaneous transfer of the hole pattern into the bottom layer of FIG. 3h to form a interconnect hole according to this invention.

Using now the silylated layer (94) as a mask, and an etch recipe with a high selectivity to SiN, line pattern (92') is transferred from the photoresist layer into the top layer (80) of the underlying composite layer to a stop on SiN, while at the same time the hole pattern (91') is transferred from the top and middle layer into the bottom layer (60) of the composite layer as shown in FIG. 3i. The etching is performed in a HDP oxide etcher with a recipe comprising Ar, CHF$_3$, C$_4$F$_8$ at flow rates between about 50 to 150, 10 to 150, and 0 to 20 sccm, respectively where the line etch stops at the middle SiN layer (70) while the hole etch stops at substrate (50) as shown in the same FIG. 3i.

Figure 3J:
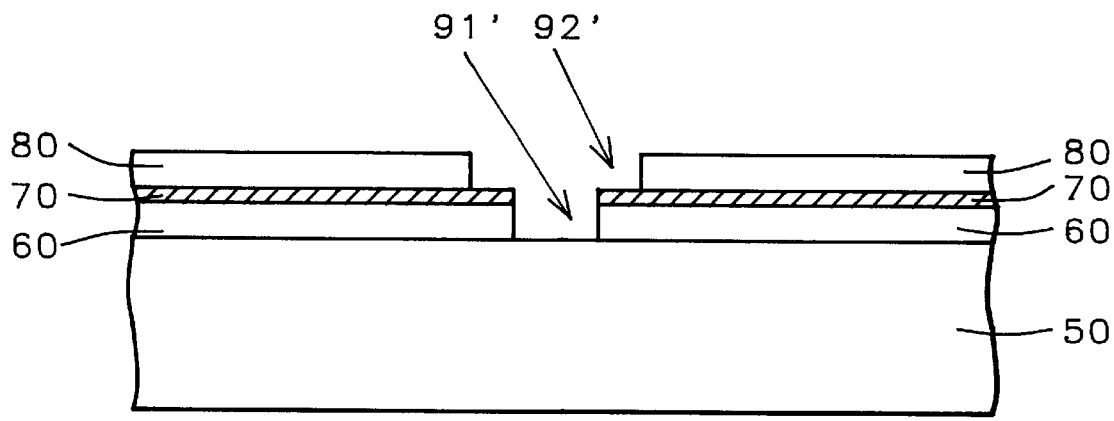
FIG. 3j is a partial cross-sectional view of a semiconductor substrate showing the dual damascene pattern in the composite insulation layer after the removal of the photoresist layers of FIG. 3i.
Figure 3K:
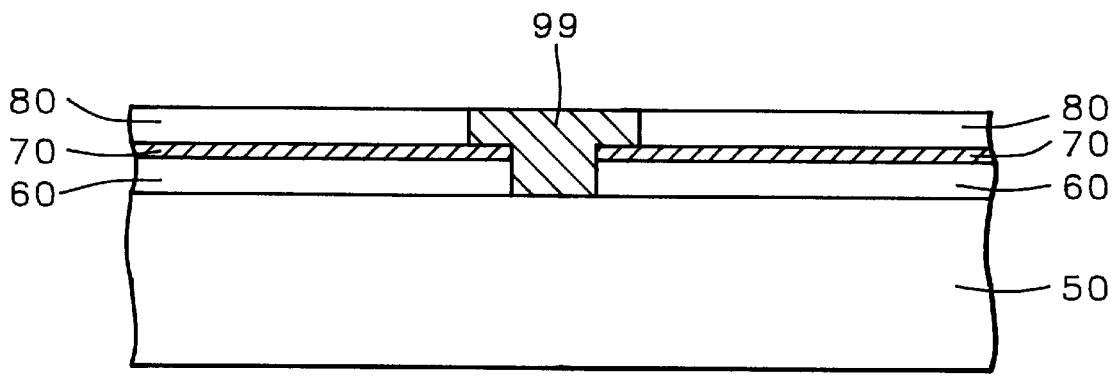
FIG. 3k is a partial cross-sectional view of a semiconductor substrate showing the depositing of metal into trench and hole of FIG. 3j to form a dual damascene structure according to this invention.

FIG. 3j shows the dual damascene structure comprising line trench (92') and vertical hole (91') thus formed with a single layer of photoresist which has now been removed. The resist removal is accomplished with oxygen plasma ashing followed by wet strip using H$_2$SO$_4$, H$_2$O$_2$ and NH$_4$OH solutions. The dual damascene metal interconnect of FIG. 3k is finally formed by depositing metal into the horizontal line trench and vertical hole combination in the composite insulation layer and planarizing the same.

In the descriptions of the embodiments given above, numerous details were set forth, such as specific materials, process parameter, etc., in order to provide a thorough understanding of the present invention. It will be obvious, however, to those skilled in the art that these specific details need not be employed to practice the present invention.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene pattern employing a single photoresist layer comprising the steps of:

providing a substrate having a composite layer of insulation deposited thereon whereby said composite layer comprises a first layer of dielectric separated from a second layer of dielectric by an intervening intermediate layer of dielectric;

forming a layer of photoresist on said composite layer of dielectric insulation;

hole patterning said layer of photoresist by exposing said photoresist using a dark field photo mask;

post-exposure baking of said layer of photoresist;

performing a wet development of said layer of photoresist;

line patterning said layer of photoresist by exposing said photoresist using a clear field photo mask;

performing a pre-silylation bake of said layer of photoresist; treating a surface portion of said layer of photoresist with a silylation process thereby forming a silylated layer of silylation regions in said layer of photoresist;

etching said second layer of dielectric underlying said layer of photoresist using said silylated layer of said layer of photoresist as a mask thereby transferring said hole pattern in said layer of photoresist into said second layer of dielectric;

etching said intermediate layer of dielectric underlying said second layer of dielectric using said silylated layer of said layer of photoresist as a mask thereby transferring said hole pattern in said layer of photoresist into said intermediate layer of dielectric;

etching said layer of photoresist to form said line pattern adjacent to said silylated layer in said layer of photoresist;

etching said composite layer of insulation thereby transferring said line pattern in said layer of photoresist into said second layer of dielectric to form a line trench, and simultaneously transferring said hole pattern in said intermediate layer of dielectric into said first layer of dielectric to form a contact hole;

removing said layer of photoresist; and depositing metal into said trench and said hole to form a dual damascene structure.

2. The method of claim 1, wherein said composite layer of insulation is planarized by means of chemical-mechanical polishing (CMP).

3. The method of claim 1, wherein said first layer of dielectric of said composite layer is phosphosilicate glass (PSG) having a thickness between about 0.3 to 0.7 micrometers ($\mu$m).

4. The method of claim 3, wherein said hole patterning is accomplished by decomposing said PAG component in light exposed field areas adjacent to said hole pattern in said layer of photoresist exposed by said exposing through said photo mask.

5. The method of claim 3, wherein said line patterning is accomplished by decomposing said PAG component in light exposed field areas adjacent to said hole pattern in said layer of photoresist exposed by said exposing through said photo mask.

6. The method of claim 1, wherein said intermediate layer of dielectric is silicon nitride (SiN) having a thickness between about 500 to 2000 angstroms (Å).

7. The method of claim 1, wherein said second layer of dielectric of said composite layer is phosphosilicate glass (PSG) having a thickness between about 0.3 to 0.7 micrometers ($\mu$m).

8. The method of claim 1, wherein said layer of photoresist has a thickness between about 0.50 to 0.90 $\mu$m.

9. The method of claim 1, wherein said layer of photoresist is a positive chemical amplification resist (CAR) having a photo acid generator (PAG) component.

10. The method of claim 1, wherein said post-exposure baking of said layer of photoresist is accomplished at a temperature between about 80° to 100° C.

11. The method of claim 1, wherein said wet development of said layer of photoresist is accomplished with a recipe comprising stream puddle with developer TMAH at 2.38%, for a about 45 to 70 seconds.

12. The method of claim 1, wherein said pre-silylation bake is performed at a temperature between about 130° to 180° C.

13. The method of claim 1, wherein said silylation process is performed with tetra-methyl-di-silazane (TMDS) at a temperature between about 140° to 210° C.

14. The method of claim 1, wherein said silylated layer has a thickness between about 1,000 to 4,000 Å.

15. The method of claim 1, wherein said etching said second layer of dielectric underlying said layer of photoresist using said silylated layer of said layer of photoresist as a mask thereby transferring said hole pattern in said layer of photoresist into said second layer of dielectric is accomplished in a HDP etcher with etch recipe comprising Ar, $CHF_3$, $C_4F_8$ at flow rates between about 50 to 150, 10 to 150 and 0 to 20 sccm, respectively.

16. The method of claim 1, wherein said etching said intermediate layer of dielectric underlying said second layer of dielectric using said silylated layer of said layer of photoresist as a mask thereby transferring said hole pattern in said layer of photoresist into said intermediate layer of dielectric is accomplished in a HDP nitride etcher with etch recipe comprising Ar, $CHF_3$, $C_4F_8$ at flow rates between about 50 to 150, 10 to 150 and 0 to 20 sccm, respectively.

17. The method of claim 1, wherein said etching said layer of photoresist to form said line pattern adjacent to said silylated layer in said layer of photoresist is accomplished in a resist HDP etcher with etch recipe comprising $O_2$, He, $SO_2$ and $CF_4$ at flow rates between about 10 to 250, 40 to 80, 10 to 80 and 0 to 50 sccm, respectively.

18. The method of claim 1, wherein etching said composite layer of insulation thereby transferring said line pattern in said layer of photoresist into said second layer of dielectric to form a line trench, and simultaneously transferring said hole pattern in said intermediate layer of dielectric into said first layer of dielectric to form a contact hole is accomplished in an oxide HDP etcher with etch recipe comprising Ar, $CHF_3$, $C_4F_8$ at flow rates between about 50 to 150, 10 to 150 and 0 to 20 sccm, respectively.

19. The method of claim 1, wherein said removing said layer of photoresist is accomplished with oxygen plasma ashing followed by wet strip using $H_2SO_4$, $H_2$ $O_2$ and $NH_4OH$ solutions.

20. The method of claim 1, wherein said metal deposited to form a dual damascene structure is copper or aluminum-copper alloy.

21. A method of forming a dual damascene pattern employing a single photoresist layer comprising the steps of:

providing a substrate having a composite layer of insulation deposited thereon whereby said composite layer comprises a top layer of dielectric separated from a bottom layer of dielectric by an intervening intermediate layer of dielectric;

forming a layer of photoresist on said composite layer;

hole patterning said first layer of photoresist;

post-exposure baking of said layer of photoresist;

superimposing a line patterning on said hole patterning in said layer of photoresist;

performing a pre-silylation bake of said layer of photoresist;

silylating said layer of photoresist to form a silylated mask comprising said hole pattern;

transferring said hole pattern in said silylated layer into said intermediate layer of said composite layer of insulation by etching;

forming line pattern in said layer of photoresist by etching;

transferring said line pattern in said layer of photoresist into said second layer of dielectric to form a line trench, and simultaneously transferring said hole pattern in said intermediate layer of dielectric into said first layer of dielectric to form a interconnect hole;

removing said layer of photoresist; and depositing metal into said trench and said hole to form a dual damascene structure and planarizing said composite layer.

22. The method of claim 21, wherein said intermediate layer of said composite layer of insulation is silicon nitride with a thickness between about 500 to 2000 angstroms (Å).

23. The method of claim 21, wherein said layer of photoresist is P-type chemical amplification resist (CAR) having a photo acid generator (PAG) agent.

24. The method of claim 21, wherein said post-exposure baking of said layer of photoresist is accomplished at a temperature between about 80° to 100° C.

25. The method of claim 21, wherein said pre-silylation bake is performed at a temperature between about 130° to 180° C.

26. The method of claim 21, wherein said silylating is accomplished with tetra-methyl-di-silazane (TMDS) at a temperature between about 140° to 210° C.

27. The method of claim 21, wherein said silylated mask has a thickness between about 1000 to 4000 Å.

28. The method of claim 21, wherein said transferring said line pattern in said layer of photoresist into said second layer of dielectric to form a line trench, and simultaneously transferring said hole pattern in said intermediate layer of dielectric into said first layer of dielectric to form a interconnect hole is accomplished in an oxide HDP etcher with etch recipe comprising Ar, $CHF_3$, $C_4F_8$ at flow rates between about 50 to 150, 10 to 150 and 0 to 20 sccm, respectively.

29. The method of claim 21, wherein said metal deposited to form a dual damascene structure is copper or aluminum-copper alloy.

* * * * *

UNITED STATES PATENT AND TRADEMARK OFFICE
CERTIFICATE OF CORRECTION

PATENT NO. : 5,877,075
DATED : 03/02/99
INVENTOR(S) : Chang-Ming Dai, Jammy Chin-Ming Huang It is certified that error appears in the above-identified patent and that said Letters Patent is hereby corrected as shown below:

On the title page, item [57], line 16, delete "Twine", and replace with --Line--.

Signed and Sealed this

Twenty-eighth Day of September, 1999

Attest:

Q. TODD DICKINSON

*Attesting Officer*  *Acting Commissioner of Patents and Trademarks*